United States Patent [19]
Allen

[11] Patent Number: 5,726,866
[45] Date of Patent: Mar. 10, 1998

[54] SLIDE OUT READILY ACCESSIBLE CHASSIS HAVING A TROUGH FOR PROTECTING CABLES AND A HINGE THAT INCLUDES A CONDUIT

[75] Inventor: Joseph R. Allen, Tomball, Tex.

[73] Assignee: Compaq Computer Corporation, Houston, Tex.

[21] Appl. No.: 601,193

[22] Filed: Feb. 14, 1996

[51] Int. Cl.$^6$ ............................................. H05K 9/00
[52] U.S. Cl. .................. 361/816; 361/683; 361/727; 361/725; 361/800; 361/818
[58] Field of Search .................. 361/683, 684, 361/727, 725, 800, 816, 818, 797, 681, 680; 174/35 GC, 51 R, 35 R; 312/223.1, 223.2, 223.3

[56] References Cited

U.S. PATENT DOCUMENTS

| | | | |
|---|---|---|---|
| 4,980,516 | 12/1990 | Nakagawa | 174/35 GC |
| 5,039,825 | 8/1991 | Samarov | 174/35 GC |
| 5,091,606 | 2/1992 | Balsells | 174/35 GC |
| 5,351,176 | 9/1994 | Stephen et al. | 361/681 |
| 5,548,083 | 8/1996 | Yamamoto | 174/35 GC |
| 5,571,256 | 11/1996 | Good et al. | 211/26 |

*Primary Examiner*—Bot L. Ledynh
*Assistant Examiner*—Anthony Dinkins
*Attorney, Agent, or Firm*—Pravel, Hewitt, Kimball & Krieger

[57] ABSTRACT

A computer system electromagnetic interference (EMI) shield housing is bolted on a rack for allowing simplified access to modules and circuit boards mounted to a chassis which is slidably mounted to the interior of the housing. EMI gasketing is mounted integral with and extending around the perimeter of a first access opening of the housing and a rear access opening of the housing. A front panel and a rear panel of the chassis provides EMI shielding when the chassis is fully recessed within the housing. The chassis can be extended beyond the housing a distance adequate to allow access to all aspects of computer system modules and to cables at the rear of the chassis. A hinge mounted to the rear of the chassis and to the interior rear of the housing in conjunction with a cable trough and conduits located on the hinge allows power and input/output (I/O) cables to move outwardly and extend with the chassis.

9 Claims, 6 Drawing Sheets

SLIDE OUT READILY ACCESSIBLE
CHASSIS HAVING A TROUGH FOR
PROTECTING CABLES AND A HINGE THAT
INCLUDES A CONDUIT

SPECIFICATION

The present invention relates to computer system mounting chassis structure, as does commonly owned, U.S. patent application Ser. No. 08/328,893, entitled "SERVER DRAWER SLIDE MOUNT APPARATUS FOR A RACK-MOUNTED COMPUTER SYSTEM," filed Oct. 25, 1994, now issued as U.S. Pat. No. 5,571,256.

BACKGROUND OF THE INVENTION

1. Field of the Invention

The present invention relates to an apparatus that minimizes the radiation of electromagnetic interference from a computer system assembled on a chassis while providing accessibility to interchangeable boards of the computer system.

2. Description of the Related Art

Electronic equipment, particularly electronic equipment using high frequency signals, generated electromagnetic interference (EMI) which could adversely affect the performance of both the EMI source electronic equipment itself and also other surrounding electronic equipment. EMI could be received through both conduction and radiation. In order to reduce EMI received through conduction, the electronic equipment usually employed such EMI reduction techniques as filtering. In order to reduce EMI radiated by source electronic equipment from propagating to surrounding electronic equipment, the source electronic equipment was typically enclosed in a metallic housing.

A commonly encountered example of such source electronic equipment that generated EMI was a computer system, such as a file server of a local area network (LAN), that was physically assembled on a chassis which was mounted on a rack structure within a cabinet assembly. The chassis contained one or more electrical backplanes with slots for receiving interchangeable boards, such as memory boards and microprocessor boards. Because of the high frequency signals used by the computer system, the computer system was a potential source of significant EMI. Thus, the chassis was typically enclosed on its mounting in the rack by a metallic housing which included removable access panels for accessing the computer system.

In order to access the interchangeable boards of the computer system, the access panels of the housing had to be removed which could be a tedious and cumbersome process, especially when the chassis was stationary and mounted on a rack structure. The panels had to also be removed to access some cables of the computer system, such as power cables, LAN cables and general purpose input/output (I/O) cables. The prior art has included a slide mount assembly for mounting the chassis to the rack structure. The chassis could be slidably moved outwardly to a position extended from the rack structure. This allowed removal of the access panels without requiring a service provider to extend into the rack structure.

Thus, in the prior art, a tradeoff has existed between providing on the one hand an apparatus to satisfactorily enclose the computer system to prevent EMI and on the other providing an apparatus which fostered accessibility to the interchangeable cards of the computer system.

SUMMARY OF THE PRESENT INVENTION

The present invention provides a new and improved apparatus for minimizing electromagnetic interference radiating from a computer system that is assembled on a chassis while also providing easy access to the interchangeable boards of the computer system. The apparatus includes a metallic housing that is mounted on a rack structure independently of the chassis. The housing, in conjunction with front and rear panels of the chassis, provides electromagnetic interference shielding for the computer system.

The otherwise enclosed housing offers two access openings. A front access opening allows the chassis to be slidably removed outwardly from the rack structure. This allows ease of access to the slidably mounted chassis so that interchangeable boards of the computer system can be replaced or serviced. A rear access opening of the housing permits access to the rear panel of the chassis.

Electromagnetic shielding gasketing that is integral with and extends around the perimeter of the front and rear access openings of the housing forms electrical seals with the front and rear panels of the chassis. The gasketing provides electromagnetic shielding when the chassis is fully retracted within the housing and the housing then closed.

In the preferred embodiment, the slidable mounting connecting the housing to the computer system is telescopic in nature. This allows the chassis to be moved to extend outwardly beyond the housing for easy access to cables located behind the chassis. Furthermore, in the preferred embodiment, a trough located on the top side of the chassis, in conjunction with a hinge coupled between the rack and the chassis, allows the cables to move and extend from the rack with the computer system.

Thus, the present invention provides an apparatus which provides both EMI shielding for the computer system on the chassis and also provides convenient access to the interchangeable boards of the computer system. Furthermore, the apparatus provides convenient access to cables extending from the rear of the chassis.

BRIEF DESCRIPTION OF THE DRAWINGS

A better understanding of the present invention can be obtained when the following detailed description of the preferred embodiment is considered in conjunction with the following drawings, in which.

DETAILED DESCRIPTION OF THE PREFERRED EMBODIMENT

Figure 1:
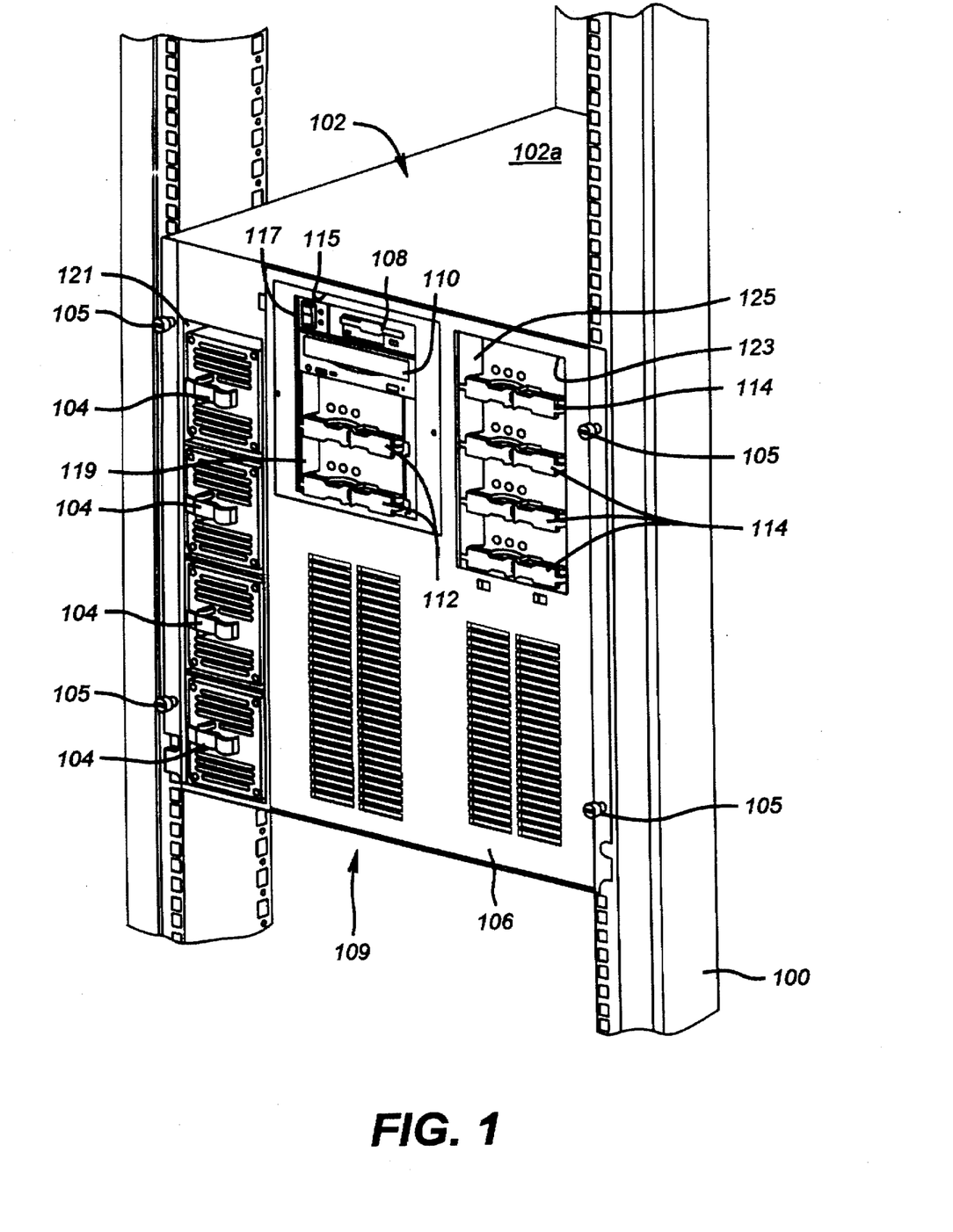
FIG. 1 is a front isometric view of one embodiment according to the present invention that illustrates a housing according to the present invention mounted with a rack structure to encase a chassis containing portions of a computer system.

As shown in FIG. 1 of the drawings, a housing 102 according to the present invention is mounted within a conventional rack structure of upright support channels, such as illustrated at 100. The housing 102 when closed in a manner set forth provides an electromagnetic shield for minimizing the radiation of electromagnetic interference (EMI) generated by a computer system 109 contained within it on a chassis 107. The housing 102 is typically made of metal in the preferred embodiment.

Figure 2:
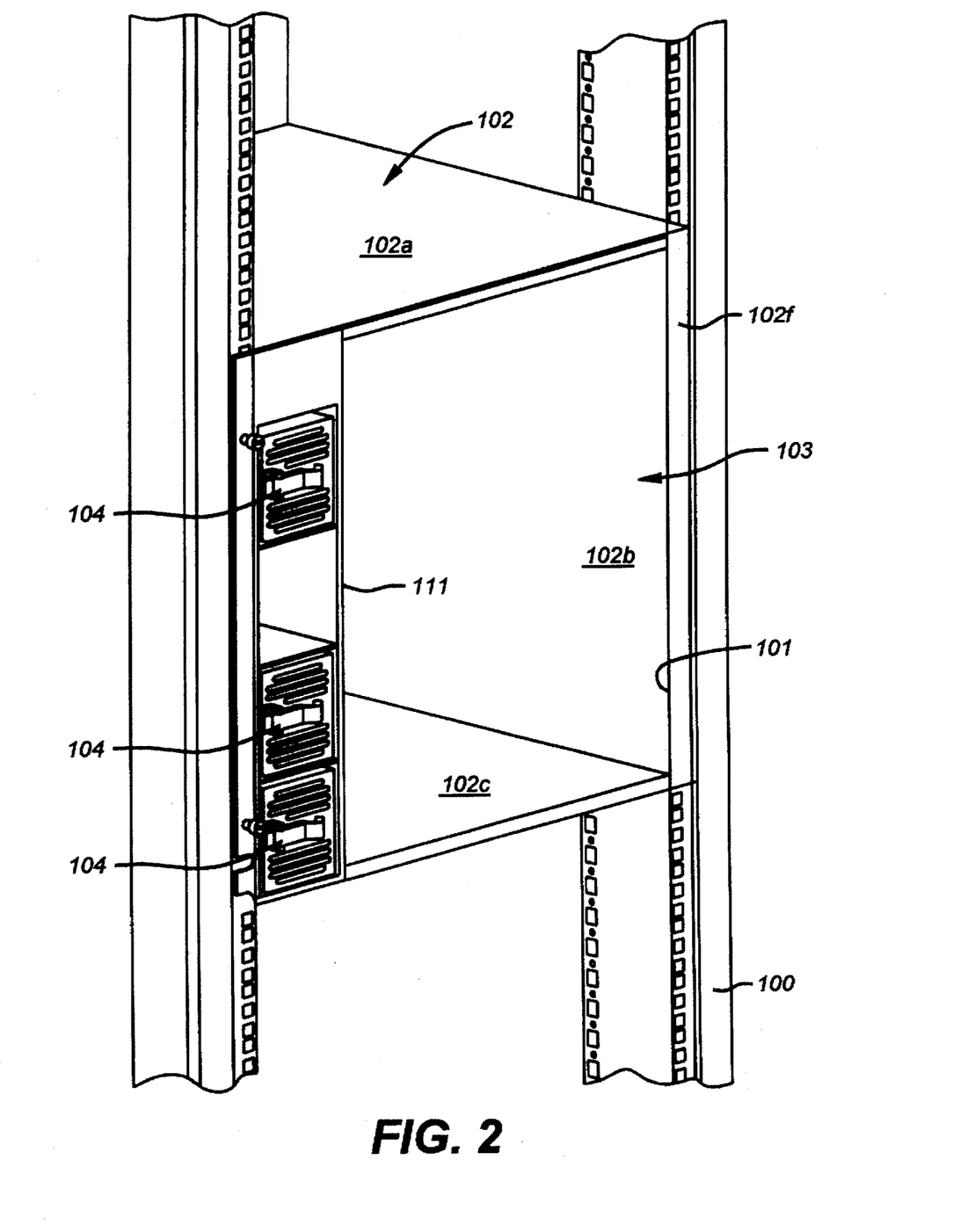
FIG. 2 is another front isometric view of the housing of FIG. 1 from a different angle with the chassis and certain other structure removed.
Figure 3:
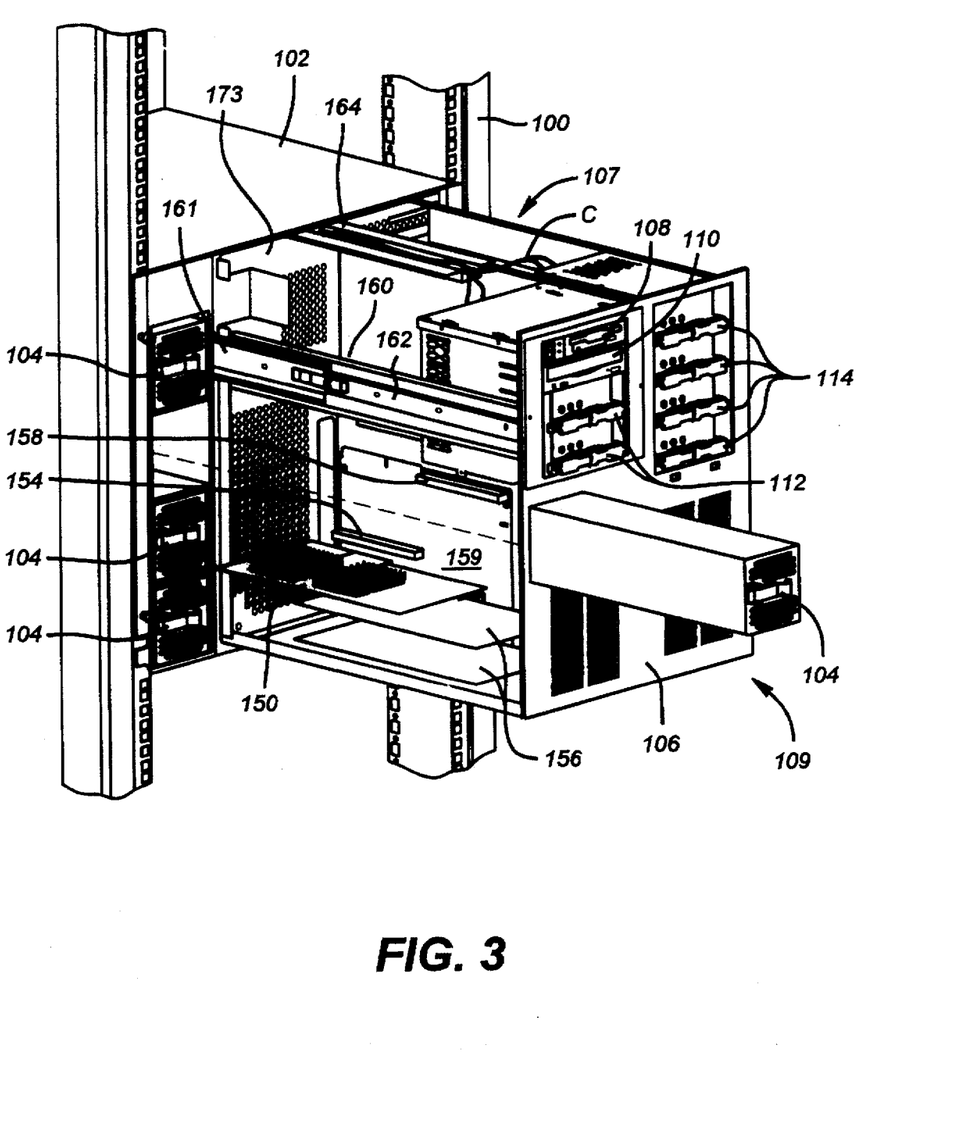
FIG. 3 is a partially exploded isometric view of the structure of FIG. 1, taken from a different angle, with the chassis extended from the housing.
Figure 4:
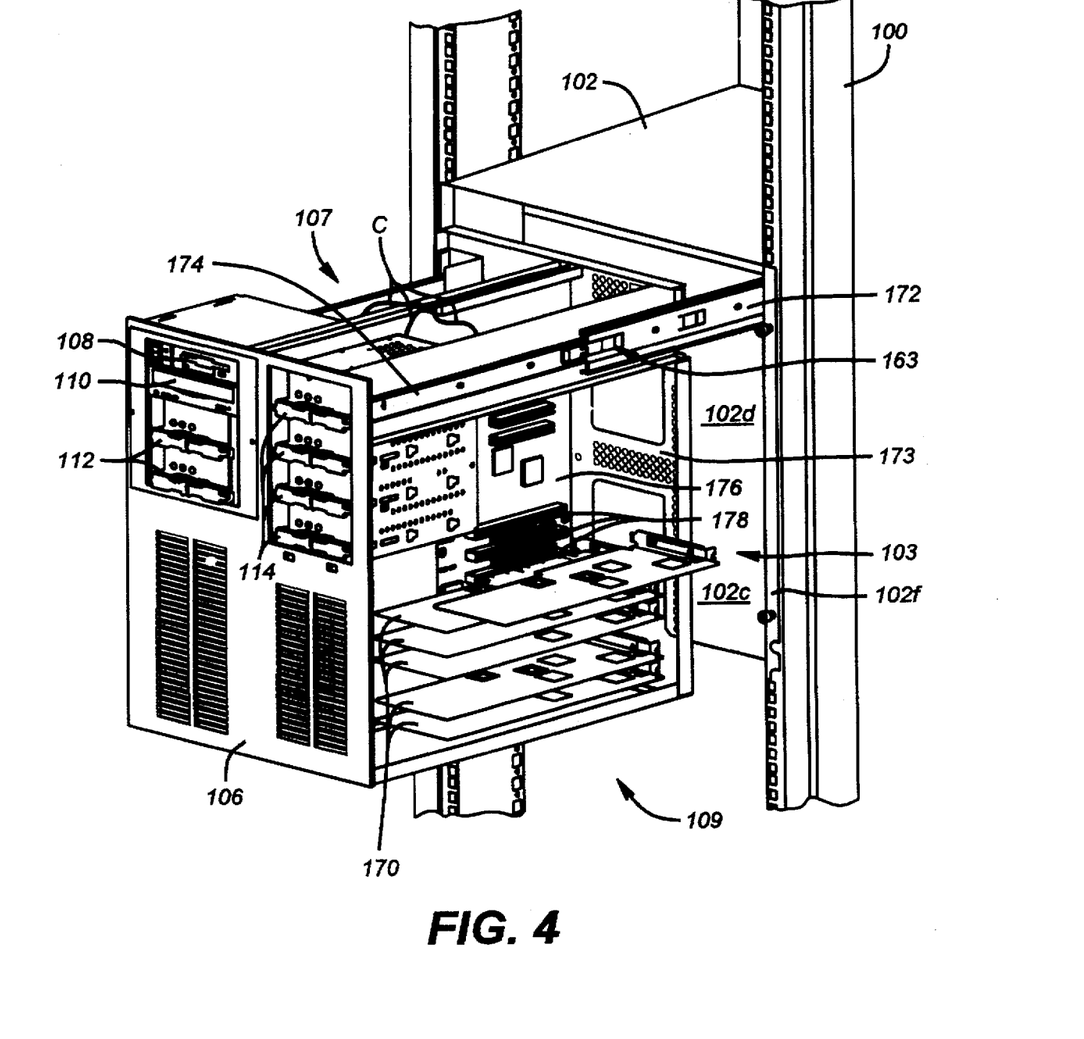
FIG. 4 is another partially exploded isometric view of the structure of FIG. 1 with the chassis extended from the housing.
Figure 5:
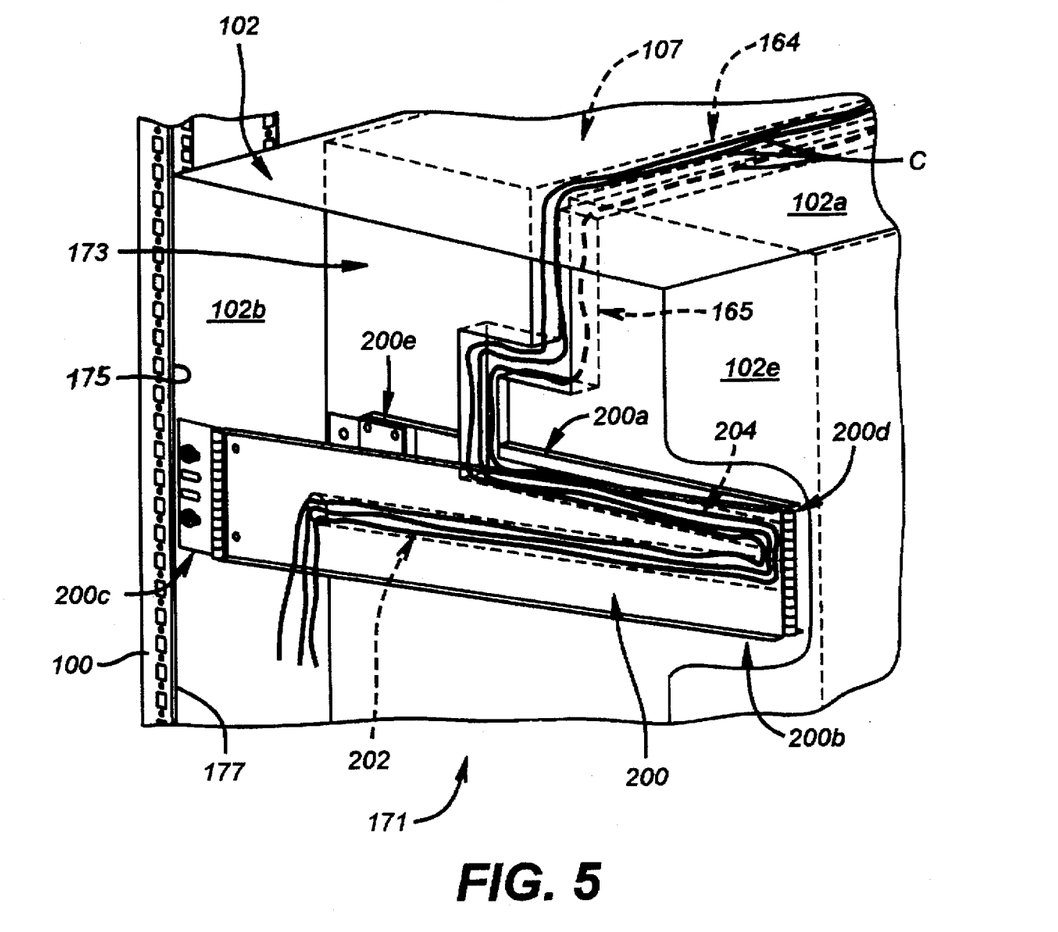
FIG. 5 is an isometric view, taken from the rear, of portions of the structure of FIG. 1.

The housing 102 has four closed rectangular walls or sides designated 102a, 102b, 102c and 102d, respectively, which are fixedly mounted together on the rack structure 100 as an integral unit. Housing 102 takes the form of a rectangular cylinder having an axis perpendicular to open front and rear sides which form access openings 103 and 171, respectively (FIGS. 2 and 5). Other than the openings 103 and 171, the sides of housing 102 provide EMI shielding for the computer component chassis 107. The opening 103 is adapted to be covered by a front panel 106 (FIG. 1) and the opening 171 is adapted to be covered by a rear panel 173 (FIGS. 3, 4 and 5). The front panel 106 and the rear panel 173, both preferably made of metal, form a part of the movable chassis 107 (FIG. 3) which serves as a support frame for mounting the computer system 109 thereon.

A shield mechanism in the form of EMI gasketing 101 is formed integral with and extending around a border or edge 102f of housing 102 adjacent the perimeter of the access opening 103. An EMI gasketing 175 is also formed integral with and extending around a border or edge 177 of housing 102 adjacent the perimeter of the rear access opening 171. The EMI gasketings 101 and 175 are typically formed from a series of spring tabs of the type known to those skilled in the art. The front closure panel 106 is adapted to be mounted on housing 102 to close the access opening 103. The rear panel 173 is adapted to be mounted on housing 102 to close the rear access opening 171.

The panel 106 is coupled or otherwise attached to the housing 102 by screws 105 or other fasteners. When the panel 106 is mounted on housing 102, the EMI gasketing 101 and the EMI gasketing 175 electrically seal the front panel 106 and the rear panel 173 to the housing 102. This seals the openings 103 and 171 in order to provide complete EMI shielding for the chassis 107.

The housing 102 forms a multi-sided enclosure providing a portion of the EMI radiation shielding about four sides for the chassis 107. When the chassis 107 is fully retracted within the housing 102, the front panel 106 closes the front access opening 103, and the rear panel 173 closes the rear access opening 171. When this occurs, the front panel 106, the rear panel 173 and the housing 102 provide a total EMI shield for the chassis 107. Thus, the present invention minimizes the radiation of EMI from the computer system 109 while facilitating access to interchangeable cards located on the chassis 107.

As shown in FIG. 2, power supplies 104 of the computer system 109 are modular in nature, and are mounted one above the other in a vertically stacked configuration in a separate side chamber or component 111 within housing 102. EMI gasketing is mounted about the front edge of compartment 111 in a like manner to gasketing 101 and 175. The modular power supplies 104 allow easy insertion and removal from their separate EMI housing 111.

The typical computer system 109 includes interchangeable boards, such as processor boards, input/output (I/O) boards and memory boards. The computer system 109 also includes a floppy drive 108, a CD-ROM drive 110 and two removable media bays 112, all of which can be mounted on the chassis 107. The floppy drive 108, the CD-ROM drive 110 and the removable media bays 112 are accessible through an opening 115 in the front panel 106, and are mounted to the front panel 106 through mounting plates 117, 121 and 119, respectively. The mounting plates 117, 119 and 121 are attached to the front panel 106 by screws and other suitable fasteners.

The front panel 106, the housing 102, and the rear panel 173, when assembled together, provide EMI shielding for the computer system 109 on the chassis 107 when the chassis 107 is recessed or retracted into the housing 102. The chassis 107 also includes an assembly for mounting on it four hotplug drives 114 of the computer system 109. The hotplug drives 114 are accessible through a port or opening 123 in the front panel 106 and are mounted to the front panel 106 through a mounting plate 125. The mounting plate 125 is attached to the front panel 106 by screws and other suitable fasteners.

The chassis 107 is movable outwardly from the housing 102 to a service position. In such a position, chassis 107 extends from the housing 102 through a left telescoping slide mount 161 (FIG. 3) and a right telescoping slide mount 163 (FIG. 4). The left slide mount 161 includes a front channel section 162 which is adapted to slide inwardly and outwardly within a rear channel section 160. The front channel section 162 is secured to the chassis 107, and the rear channel section 160 is slidably mounted to the interior of the housing 102.

The right side mount 163 also includes a front channel section 174 which is adapted to slide inwardly and outwardly within a rear channel section 172. The front channel section 174 is secured to the chassis 107, while the channel 172 is slidably mounted to the interior of the housing 102. The telescoping slide mounts 161 and 163 allow the chassis 107 to be slidably moved outwardly to a position extended from the support channels 100.

The composite length of the channel section components of both of telescoping slide mounts 161 and 163 is greater than the length of chassis 107. Thus, the chassis 107 can be moved outwardly from housing on slide mounts 161 and 163 for free access. Usually, slide mounts 161 and 163 are of a composite length allowing outward movement so that the chassis 107 can extend (FIG. 4) up to five inches beyond the support channels 100.

This telescoping feature provided by slide mounts 161 and 163 allows access to the rear of the chassis 107 (FIG. 5), including access to the power supply and input/output (I/O) cables C. In the preferred embodiment, the cables C are ultra flex, twelve gauge cables which typically contain several hundred strands of wire. Integrity of these wire strands is important to satisfactory transfer of both signals and operating power to the computer system 109. As will be set forth, the present invention provides protection against crimping or damage of the cables C during movement of the chassis 107.

A generally U-shaped open trough or channel member 164 (FIGS. 3, 4 and 5) is mounted at an upper portion of the chassis 107 for movement with it to receive and support, as well as provide a protective conduit for, the cables C. The open trough 164 minimizes any crimping or pinching of the cables C between moving structural elements when the chassis 107 is being moved with respect to the housing 102.

The chassis 107 provides open access to processor boards 150 and memory boards 156 located on the left side of the chassis 107 (FIG. 3) adjacent slide mount 161. When the chassis 107 is extended outwardly from the support channels 100, the processor board 150 and memory boards 156 can be easily removed and inserted into their respective processor board slots 154 and memory board slots 158 which are coupled in the conventional manner to a central processing unit (CPU) board 159.

The right side of the chassis 107 (FIG. 4) adjacent slide element 163 provides an open access to a vertically arranged group of interchangeable boards 170. The interchangeable boards 170 are electrically coupled to a Peripheral Component Interconnect (PCI)/Extended Industry Standard Architecture (EISA) I/O board 176 through slots 178.

The cables C move inwardly and outwardly with the chassis 107 within the housing 102 as the chassis 107 is extended and retracted. The trough member 164 (FIGS. 3 and 5) provides, as has been set forth, a structure for receiving and supporting the cables C while the chassis 107 is moved. The present invention also provides protection against damage to those portions of cable C between housing 102 and chassis 107.

The trough 164 is attached to an upwardly extending conduit 165 which is located on an exterior rear panel 173 of the chassis 107. The conduit 165 serves as a guide, directing the cables C to a conduit 204 which is mounted with and extends along a forward arm 200a of a horizontally pivotable hinge 200. The forward hinge arm 200a is mounted and movable with the chassis 107.

A conduit 202 in communication with conduit 204 extends along and is secured to a rear arm 200b of the hinge 200. The rear hinge arm 200b is pivotally movable with respect to forward hinge arm 200a, and is also mounted and movable with the interior of side wall 102b of the housing 102. The conduit 202 receives the cables C from the conduit 204. The conduits 165, 202 and 204 provide support and protection for the cable C against damage during relative movement of chassis 107 with respect to housing 102.

The rear hinge arm 200b has a rear end 200c opposite a hinged connection 200d secured to the housing 102. The forward hinge 200a has its forward end 200e opposite connection 200d secured to the chassis 107. Thus, the cables C, which are contained and protected in the trough 164 and threaded through conduits 165, 204 and 202, can move inwardly and outwardly to extend with the chassis 107, without crimping or pinching between components when the chassis 107 is extended and retracted.

Figure 6:
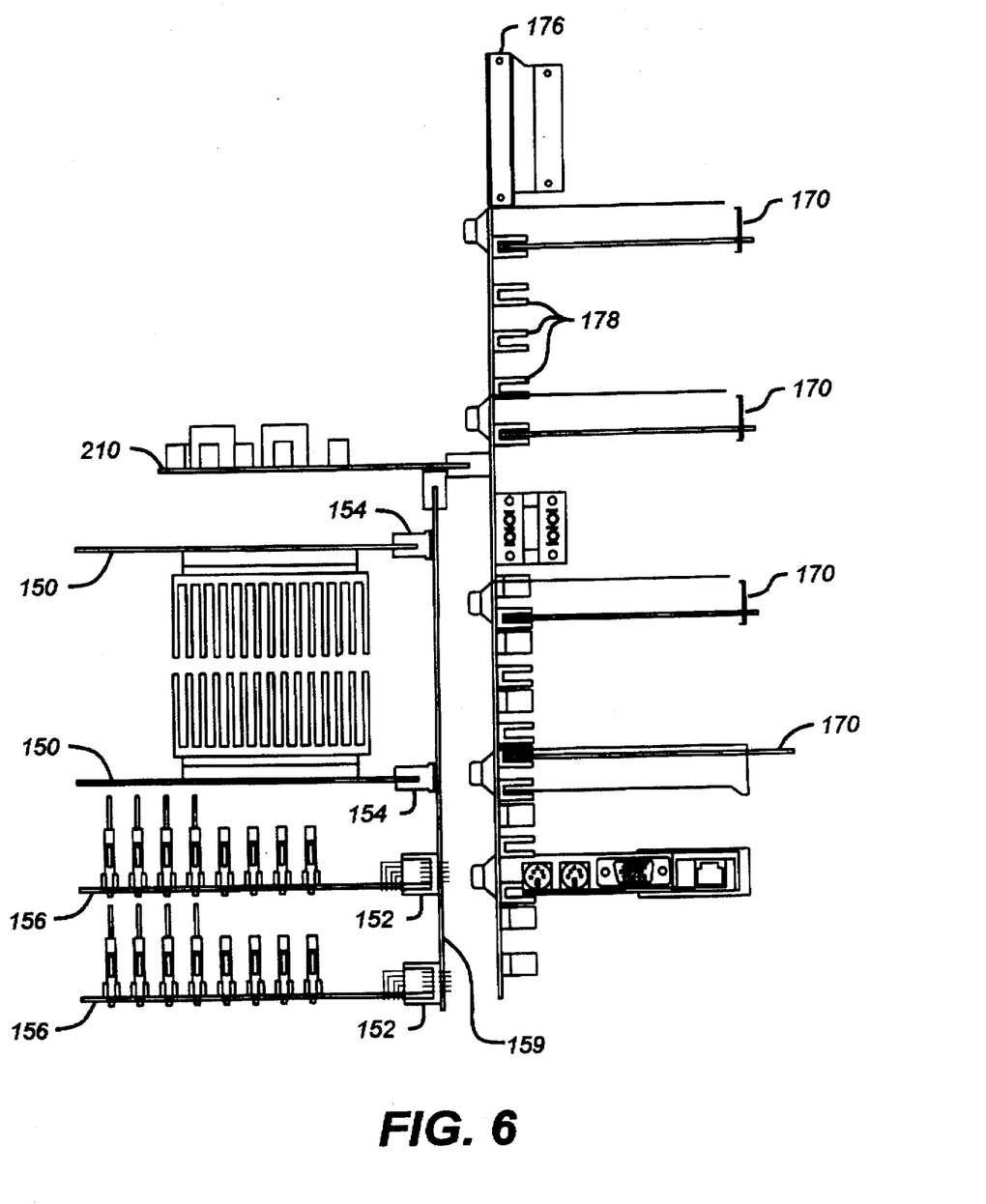
FIG. 6 is a schematic diagram illustrative of the configuration and location of components of the computer system on the chassis of FIG. 1.

The chassis 107 also provides a physical structure for securing electrical backplane boards. The interchangeable boards of the chassis 107 are removably coupled to slots in these backplane boards. Shown in FIG. 6 is the PCI/EISA board 176 which has the slots 178 for connecting the EISA or PCI interchangeable boards 170 to a respective PCI or EISA bus. An interconnect board 210 distributes power to the drives 114, 112, 108 and 110. The CPU host board 159 contains the slots 154 for the processor boards 150 and the slots 158 for the memory boards 156. The processor boards 150 and the memory boards 156 are accessible on the left side of the chassis 107, and the I/O boards 170 are accessible on the right side of the chassis 107.

In summary, the present invention facilitates access to interchangeable boards mounted to the chassis 107. The chassis 107 can be retracted inwardly and extended outwardly from the support channels 100. When the chassis 107 is fully recessed within the housing 102, the front panel 106 closes the front access opening 103, and the rear panel 173 closes the rear access opening 171 to provide complete EMI shielding. The EMI gasketing 101 integral with and extending around the front perimeter of housing 102 electrically seals the front panel 106 to the housing 102. The EMI gasketing integral with and extending around the perimeter of housing 102 electrically seals the rear panel 173 to the housing 102. The rear of the chassis 107 can also be extended outwardly beyond the support channels 100 which allows access to the cables C protruding from the rear of the chassis 107. Furthermore, the hinge 200, the conduit 165 and the open trough 164 furnish the apparatus for protecting the cables C as the cables C extend and retract with the chassis 107.

The foregoing disclosure and description of the invention are illustrative and explanatory thereof, and various changes in the size, shape, materials, and components as well as in the details of the illustrated construction and method of operation may be made without departing from the spirit of the invention.

I claim:

1. An apparatus for reducing electromagnetic interference from a computer system, the apparatus comprising:

a mounting rack;

a multisided enclosure having a first access opening for forming a partial electromagnetic interference shield for the computer system contained therein;

a first electromagnetic gasketing formed around the perimeter of the first access opening of said enclosure;

a chassis slidably mounted to said enclosure for retracting within the interior of said enclosure and for extension beyond the first access opening of said enclosure, said chassis providing electrical connections for one or more interchangeable boards that are accessible through one or more board access openings of said chassis, said chassis having a front panel for providing a complete electromagnetic shield for the computer system when in contact with said first electromagnetic gasketing; and a hinge having a first end secured to said enclosure and a second end secured to said chassis for protecting cables during movement of said chassis, said hinge including a conduit for containing the cables.

2. The apparatus of claim 1, wherein said enclosure has a second access opening and said enclosure forms a rectangular cylinder having an axis perpendicular to the first and second access openings, said apparatus further comprising:

a second electromagnetic gasketing formed around the perimeter of the second access opening of said enclosure, and wherein said chassis has a rear panel for providing the complete electromagnetic shield for the computer system when in contact with said second electromagnetic gasketing.

3. The apparatus of claim 1, wherein said enclosure has four closed sides and one open side that forms the access opening of said enclosure.

4. The apparatus of claim 1, wherein the mounting of said chassis to said housing includes a first channel secured to said chassis and a second channel coupled to said housing adapted to slide within said first channel.

5. The apparatus of claim 3, wherein said first channel and said second channel form a telescoping slide mount.

6. The apparatus of claim 1, wherein said chassis can extend a predetermined distance from the access opening of said enclosure.

7. The apparatus of claim 1, wherein said chassis includes a trough for protecting cables of the computer system.

8. The apparatus of claim 1, wherein said enclosure is fixedly mounted with the mounting rack.

9. An apparatus for reducing electromagnetic interference from a computer system, the apparatus comprising:

a mounting rack;

a multisided enclosure having a first access opening for forming a partial electromagnetic interference shield for the computer system contained therein;

a first electromagnetic gasketing formed around the perimeter of the first access opening of said enclosure; and a chassis slidably mounted to said enclosure for retracting within the interior of said enclosure and for extension beyond the first access opening of said enclosure, said chassis providing electrical connections for one or more interchangeable boards that are accessible through one or more board access openings of said chassis, said chassis having a front panel for providing a complete electromagnetic shield for the computer system when in contact with said first electromagnetic gasketing;

a hinge having a first end secured to said enclosure and a second end secured to said chassis for protecting cables during movement of said chassis, said hinge includes a conduit for containing the cables; and said chassis includes a trough for protecting cables of the computer system.

* * * * *